(12) United States Patent
Le Leannec et al.

(10) Patent No.: US 7,113,643 B2
(45) Date of Patent: Sep. 26, 2006

(54) METHOD AND DEVICE FOR FORMING A DERIVED DIGITAL SIGNAL FROM A COMPRESSED DIGITAL SIGNAL

(75) Inventors: Fabrice Le Leannec, Cesson Sevigne (FR); Patrice Onno, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 793 days.

(21) Appl. No.: 10/279,729

(22) Filed: Oct. 25, 2002

(65) Prior Publication Data
US 2003/0128878 A1 Jul. 10, 2003

(30) Foreign Application Priority Data
Oct. 25, 2001 (FR) .................................. 01 13819

(51) Int. Cl.
*G06K 9/36* (2006.01)
*G06K 9/46* (2006.01)
(52) U.S. Cl. ...................................... 382/235; 382/240
(58) Field of Classification Search ................ 382/233, 382/235, 240
See application file for complete search history.

(56) References Cited

U.S. PATENT DOCUMENTS

| 6,205,457 B1 | 3/2001 | Hurwitz ...................... 707/703 |
| 6,314,452 B1* | 11/2001 | Dekel et al. ................ 709/203 |
| 6,704,798 B1* | 3/2004 | Mogul ......................... 709/246 |
| 6,711,297 B1* | 3/2004 | Chang et al. ............... 382/240 |

FOREIGN PATENT DOCUMENTS

GB 2348074 9/2000

WO 97/30551 8/1997
WO 00/65838 11/2000

OTHER PUBLICATIONS

Blumberg R. et al; "Visual Realism and Interactivity for the Internet"; Proceedings of IEEE Compcon '97; Feb. 23-26, 1997.
Hauf C.R. et al; "The Flashpix (TM) Image File Format"; Final Program and Proceedings of the IS&T/SID Color Imaging Conference: Color Science, Systems, and Applications; Nov. 19-22, 1996, pp. 234-238.
Lee D.T.; "New Opportunities in Digital Imaging Systems"; Proceedings of the International Conference on Image Processing (ICIP) Lausanne; Sep. 16-19, 1996; vol. 1; pp. 431-434.
Boliek M. et al; "Next Generation Image Compression and Manipulation Using Crew"; Proceedings of the International Conference on Image Processing; ICIP 1998; Oct. 26-29, 1997; IEEE Computer Society, US; vol. 3; pp. 567-570.
Deshpande S. et al; "HTTP Streaming of JPEG2000 Images"; Proceedings International Conference on Information Technology: Coding and Computing; Apr. 2, 2001; pp. 15-19.

* cited by examiner

*Primary Examiner*—Phuoc Tran
(74) *Attorney, Agent, or Firm*—Fitzpatrick, Cella, Harper & Scinto

(57) ABSTRACT

A method of forming a derived digital signal from a compressed digital signal which has been obtained by compressing an original digital signal including original data representing physical quantities and grouped together in blocks of data ordered in the original signal. The method includes obtaining information contained in the compressed digital signal and representing the structure of the signal and the organization of the data therein, and from the information, forming a skeleton of the derived digital signal which at least partly includes this information and at least one leader and one body intended to subsequently contain compressed blocks of data, the skeleton thus formed being in accordance with a description syntax of the compressed signal.

26 Claims, 11 Drawing Sheets

Structure of initial image (server)

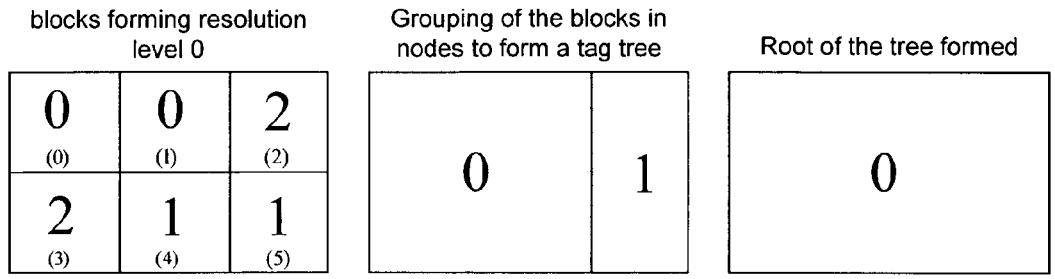

*Figure 9a*

| Request for blocks | Partial codes of the tree to indicate the inclusion of each of the blocks in the packet in question | | | | | | State of the tree formed with the blocks of resolution level 0 |
|---|---|---|---|---|---|---|---|
| GetCBK(1,l=0) | 110 (0) not included | 1 (1) included | 0 (2) not included | 0 (3) not included | 0 (4) not included | 0 (5) not included | tree with root 0, children 0 and ≥1; (≥1)(0)(≥1)(≥1) (≥1)(≥1) at (0)(1)(3)(4) (2)(5) |
| GetCBK(3,l=0) | 110 (0) not included | 1 (1) included | 0 (2) not included | 1 (3) included | 0 (4) not included | 0 (5) not included | tree (≥1)(0)(0)(≥1) (≥1)(≥1) |
| GetCBK(0,l=0) | 111 (0) included | 1 (1) included | 0 (2) not included | 1 (3) included | 0 (4) not included | 0 (5) not included | tree (0)(0)(0)(≥1) (≥1)(≥1) |
| GetCBK(5,l=0) | 111 (0) included | 1 (1) included | 10 (2) not included | 1 (3) included | 0 (4) not included | 1 (5) included | tree (0)(0)(0)(≥1) (≥1)(0) |
| ........ | ... | ... | ... | ... | ... | ... | ... |

*Figure 9b*

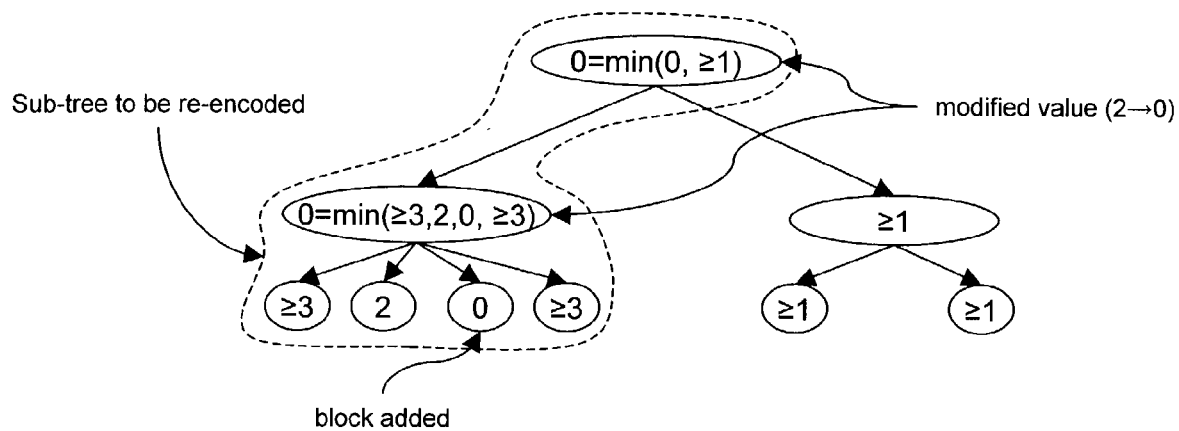
*Figure 12.a*
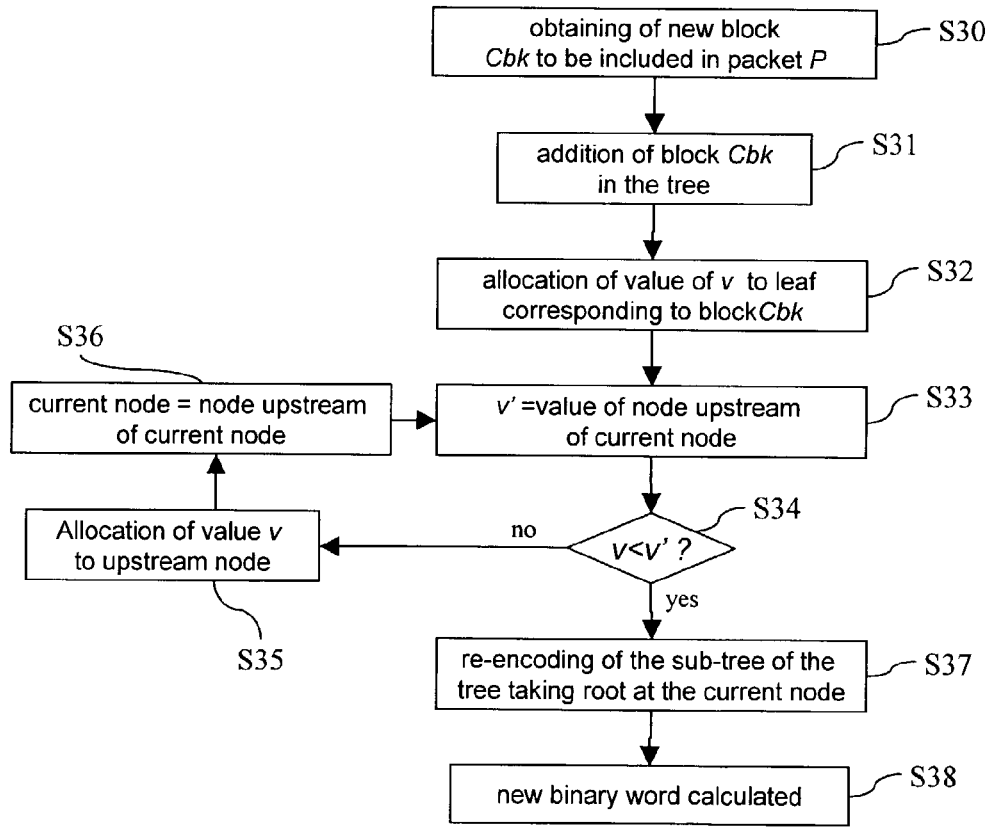
*Figure 12.b*

METHOD AND DEVICE FOR FORMING A DERIVED DIGITAL SIGNAL FROM A COMPRESSED DIGITAL SIGNAL

The present invention concerns a method of forming a derived digital signal from a compressed digital signal which was obtained by compressing an original digital signal, the original signal including original data representing physical quantities and grouped together in blocks of data ordered in said original signal.

The invention applies notably in the field of the processing of compressed images and, for example, in the field of the processing of compressed images in accordance with the JPEG2000 standard.

According to this standard, a compressed image digital signal has a general structure including a main header and a body which contains, in compressed form, original data representing physical quantities which are the pixels and which are grouped together in blocks of data ordered in the signal and known as code-blocks under the JPEG2000 standard.

Each compressed block of data is a compressed representation of an elementary rectangular part of the image signal which has been transformed, in a known manner, into frequency sub-bands.

More particularly, the body of the compressed digital signal contains data packets which each consist of a packet header and a packet body.

The packet body in its turn contains several compressed block of datas and the header of the packet contains notably a list of all the blocks contained in the packet body.

It should be noted that each block of data is compressed on several quality levels or layers and that each quality level or layer of a block is in a distinct packet.

In general, a compressed image digital signal in accordance with JPEG2000 standard contains several sets of compressed block of datas each corresponding to a given tile (if the image signal is decomposed into a tile or tiles), a component (e.g. luminance or chrominance), a resolution level, a quality level and a spatial position.

In a communication architecture of the client-server type, the user receives and stores a compressed image digital signal.

The signal thus received is then decompressed and restored in the client computer so that the user can use the image signal or a part thereof if he so wishes.

The transmission of the computer file containing the compressed data can take a relatively long time if the file is bulky.

In addition, the transmission of such a file may be subject to interference which may make certain data erroneous.

This phenomenon is accentuated when the file is bulky.

In addition, it is not rare for problems related to the computer hardware to arise during the reception and storage of a data file and for some of the data to be lost to the user, or even the entire file.

It also happens from time to time that excessively bulky files quite simply cannot be used by the user because of the insufficient storage and processing capacities of the computer of the user.

Moreover, in some situations, not all of a compressed digital signal, which is for example an image signal, is of interest to the user.

The user may wish to interest himself in fact more particularly in a part of the image signal or in a given resolution level rather than all the resolution levels, without needing to decompress all the signal.

It would consequently be advantageous to have a novel method and a novel device for using only part of the data contained in a compressed digital signal.

It should be noted that the, problems mentioned above can be posed just as well with a compressed image digital signal according to JPEG2000 standard or with any type of compressed digital signal (sound signals, video signals, data signals issuing from a facsimile machine or other electronic equipment etc).

The present invention aims to remedy at least one of the aforementioned drawbacks by proposing a method of forming a derived digital signal from a compressed digital signal which has been obtained by compressing an original digital signal including original data representing physical quantities and grouped together in blocks of data ordered in said original signal, wherein said method includes the following steps obtaining information contained in the compressed digital signal and representing the structure of said signal and the organization of the data therein, and from said information, forming a skeleton of the derived digital signal which at least partly includes this information and at least one header and one body intended to subsequently contain compressed blocks of data, said skeleton thus formed being in accordance with a description syntax of the compressed signal.

Correlatively, the invention also relates to a device for forming a derived digital signal from a compressed digital signal which has been obtained by compressing an original digital signal including original data representing physical quantities and grouped together in blocks of data ordered in said original signal, wherein said device has;

means of obtaining information contained in the compressed digital signal and representing the structure of said signal and the organization of the data therein, and means of forming a skeleton of the derived digital signal from said information which at least partly includes this information and at least one header and one body intended to subsequently contain compressed blocks of data, said skeleton thus formed being in accordance with a description syntax of the compressed signal.

The formation of such a skeleton of the derived signal makes it possible to subsequently insert the required blocks of data in the body defined within the skeleton.

Thus, for example, it would be possible to insert the blocks corresponding to a part of the signal only or those which contribute to a resolution and/or to a given quality level in the case of an image signal.

In the case of a client-server communication architecture, it is possible to insert, in the body of the skeleton, the blocks which have been received from the server. These blocks may correspond to those which were the subject of a request to the server. In the case of faulty transmission, these blocks may correspond only to those blocks received and able to be used by the client.

Moreover, the fact that the skeleton is in accordance with a description syntax of the compressed signal makes it able to be decompressed independently of the compressed blocks of data inserted subsequently.

Such a signal is therefore immediately usable as soon as its skeleton is formed and therefore even before a compressed block of data has been received.

According to one characteristic, the method includes the following steps:

obtaining at least one block of data from the compressed digital signal, and inserting said block of data in the body of the skeleton of the derived digital signal.

Thus at all times, as the blocks are inserted, a derived signal able to be decompressed is available.

It is possible for example to insert the blocks one by one in the body of the skeleton after having obtained a certain number of them.

According to one characteristic, the insertion of a block of data in the body of the skeleton of the derived digital signal is performed as soon as this block of data is obtained.

Thus the bit stream of the derived digital signal is constructed progressively as a compressed block of data is inserted.

The signal which results from the insertion of the block is at all times able to be decompressed, even if the following blocks are transmitted erroneously or are not received.

According to another characteristic, the block of data is obtained with the order allocated to it in the compressed digital signal and account is taken of this order in inserting it in the body, which makes it possible to be in conformity with the description syntax of the compressed signal.

This compressed signal is for example in accordance with JPEG2000 standard.

According to one characteristic, at least one header of the skeleton of the derived digital signal including information representing the compressed blocks of data contained in the body, the method according to the invention includes a step of modifying this header according to the insertion of at least one block of data in the body.

Thus the information on the structure of the signal and the organization of the data contained in this signal are updated as soon as a modification of the data occurs, which makes the signal able to be decompressed at any time.

According to another characteristic, the blocks of data of the original digital signal having been compressed according to at least one quality level, the compressed blocks of data are organized in the body of the skeleton of the derived digital signal according to a single quality level.

The organization of the data in the derived digital signal according to a single quality level considerably simplifies the updating of the header information when a new block of data is inserted.

According to one characteristic, when each of the blocks of data of the original digital signal has been compressed according to several quality levels, the different quality layers constituting each of the compressed blocks of data are inserted in the body in increasing order of said quality levels.

This organization of the data in the derived digital signal is necessary in order to be able to subsequently carry out a decompression of these data.

According to one characteristic, the method includes, a step of constructing a tag tree of the blocks of data inserted in the body of the skeleton, the presence of said blocks of data being identified for each of them by a code value.

This tree lists the different blocks present in the derived signal and will facilitate the updating of the information in this signal.

According to one characteristic, the method includes a step of updating at least some of the coded values of the tag tree according to the insertion of a block of data in the body of the skeleton.

Thus, advantageously, the method makes it possible to update only the values affected by the insertion without needing to routinely update all the values in the tree.

In a communication architecture of the client-server type, the step of forming a skeleton of the derived digital signal is effected in a first communication apparatus which communicates at a distance with a second communication apparatus in which the compressed digital signal is stored.

The compressed signal is therefore not necessarily present in the first apparatus for the invention to be able to be implemented.

Only some information is necessary to the formation of the derived signal in the first communication apparatus, notably the information representing the structure of the compressed signal and the organization of the data in it.

According to one characteristic, the step of forming the skeleton of the derived digital signal is performed whilst not all the data contained in the compressed digital signal have been received.

It is in fact possible to conceive that the skeleton is formed whilst no block of data has been received or the blocks are currently being transmitted.

According to one characteristic, the method includes a step of transmission to the second communication apparatus of a request for obtaining information contained in the compressed digital signal and representing the structure of said compressed signal and the organization of the data therein, prior to the step of obtaining said information.

This makes it possible to obtain the required information whilst the compressed signal is still stored in the second apparatus and the compressed blocks are not yet available to the first apparatus.

According to another characteristic, the method includes a step of transmitting to the second communication apparatus a request for obtaining at least one block of data, prior to the step of obtaining said block of data.

It is thus possible to select the block or blocks to be inserted in the derived signal according to the interest of the user.

The invention also concerns a data processing apparatus having a device for forming a derived digital signal as briefly disclosed above.

According to another aspect, the invention also relates to:
an information storage means which can be read by a computer or a microprocessor including code instructions of a computer program for the execution of the steps of the method of forming a derived digital signal according to the invention as briefly disclosed above, and
an information storage means which is removable, partially or totally, and which can be read by a computer or a microprocessor including code instructions of a computer program for the execution of the steps of the method of forming a derived digital signal according to the invention as briefly disclosed above.

According to yet another aspect, the invention relates to a computer program which can be loaded into a programmable apparatus, including sequences of instructions or portions of software code for implementing the steps of the method of forming a derived digital signal of the invention as briefly disclosed above, when said computer program is loaded and executed on the programmable apparatus.

The characteristics and advantages relating to the device for forming a derived digital signal, to the data processing apparatus including such a device, to the information storage means and to the computer program being the same as those disclosed above concerning the method of forming a derived digital signal according to the invention, they will not be repeated here.

Other characteristics and advantages of the present invention will emerge more clearly from a reading of the following description given with reference to the accompanying drawings, in which:

FIG. 9a illustrates the construction of a tag tree for indicating the inclusion of blocks of data in a packet;

FIG. 9b is a table giving the main steps of constructing and updating the tag tree of FIG. 9a according to the obtaining of different blocks;

FIG. 10 is an algorithm for updating the tag tree of FIG. 9a;

FIG. 12a illustrates an example of a tag subtree to be updated;

FIG. 12b is an algorithm for updating the tag tree of FIG. 11a.

Figure 1:
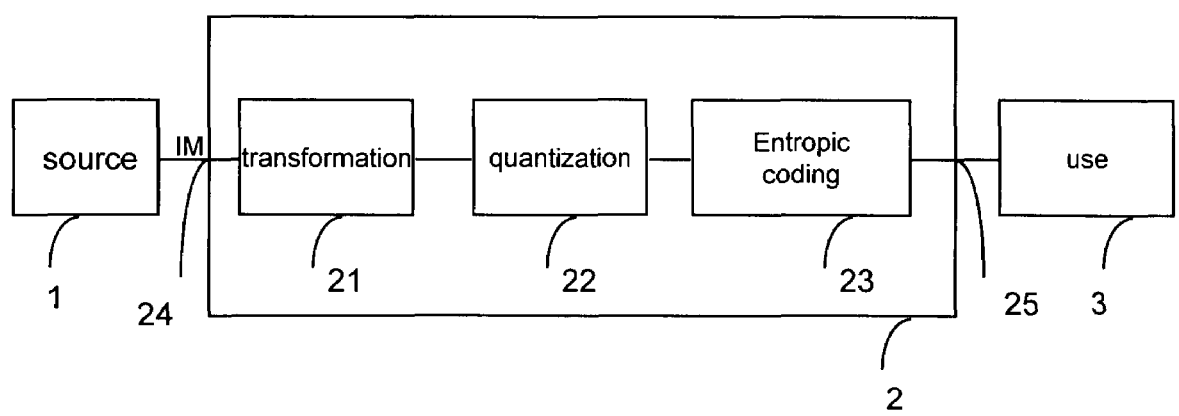
FIG. 1 depicts schematically a digital signal compression device.

FIG. 1 depicts a data compression device 2 which has an input 24 to which a source 1 of non-compressed original digital data is connected.

The source 1 includes for example a memory means, such as a random access memory, hard disk, diskette or compact disk for storing non-compressed data, this memory means being associated with a suitable reading means for reading the data therein. A means for recording the data in the memory means can also be provided.

It will be considered more particularly hereinafter that the original data to be compressed are a series of digital samples representing physical quantities and representing for example an image IM.

This image is for example more particularly in accordance with the JPEG2000 standard.

The source 1 supplies a digital image signal IM at the input of the compression device 2. The image signal IM is a series of digital words, for example bytes. Each byte value represents a pixel of the image IM, here with 256 levels of gray, or black and white image. The image can be a multispectral image, for example a color image having components in three frequency bands, of the red-green-blue type or luminance and chrominance. Either the color image is processed in its entirety, or each component is processed in a similar manner to the monospectral image.

Means 3 using compressed data are connected at the output 25 of the compression device 2.

The user means 3 include for example means of storing compressed data, and/or means of transmitting compressed data.

The compression device 2 conventionally has, as from the input 24, a transformation circuit 21 which implements decompositions into signals of frequency sub-bands of the data signal, so as to effect an analysis of the signal.

However, the decomposition into frequency sub-bands is not essential.

Other transformations can of course be envisaged.

It should be noted that it is possible to dispense with the transformation circuit.

The transformation circuit 21 is connected to a quantization circuit 22. The quantization circuit implements a quantization known per se, for example a scalar quantization, or a vector quantization, of the coefficients, or groups of coefficients, of the frequency sub-band signals supplied by the circuit 21.

The circuit 22 is connected to an entropic coding circuit 23, which performs an entropic coding, for example a Huffman coding, or an arithmetic coding, of the data quantized by the circuit 22.

The compressed digital image signal has a general structure which includes a main header and a body including, in compressed form, the original data referred to above and which are grouped together in blocks of data (referred to as code blocks under the JPEG2000 standard) ordered in the signal. It should be noted that the blocks were compressed independently of each other.

The end of the digital signal is indicated by a marker.

More particularly, the image signal is for example partitioned into zones known as tiles, which are themselves each partitioned into blocks of data.

In the compressed digital image signal, the data are organized in data packets P(r,q) where r and q are integers representing respectively the resolution and the quality layer or level of the packet.

It should be noted that, in the context of JPEG2000 standard, the data packets are indexed according to the tiles, the components, the resolution levels, the spatial locations ("precincts") and the quality levels.

However, for reasons of simplification, merely the notation P (r, q) will be used.

This packet contains a packet header which forms part of the header information mentioned above and a packet body. This header describes the content of the data included in the packet body and a series of coding parameters for each of the blocks of data, at resolution r and for the quality layer q.

The body of each packet contains blocks of data which each correspond to the contribution of a block of data for the resolution r and the quality layer q of the packet in question.

This contribution of a block of data to a packet is also called the quality level or layer of the block.

One and the same block of data corresponding to a precise precinct of the image has different quality levels present in the respective bodies of different packets.

The packet header gives a list of the blocks actually present in the packet and the parameters concerning each block.

The packets of the compressed image signal are for example organized by resolution. The bit stream contains first of all all the packets concerning the first resolution, then the packets of the second resolution, and so on. This arrangement makes it possible to extract the resolutions one by one without having to run through the bit stream as a whole. The bit stream is then said to be progressive in terms of resolution.

It should be noted that the bit stream could be organized in a different manner. For example, the packet P(0,0) could be followed by the packet P(1,0), itself followed by the packet P(2, 0) and so on. In this case, the first layer corresponds to a given quality for all the resolutions, for example 0.01 bpp (bits per pixel). The following layers contain additional data and correspond respectively to higher qualities. The representation of the data is then said to be progressive in terms of quality.

In the example embodiment, the compressed signal is for example progressive in terms of resolution and has three resolution levels and two quality layers.

Figure 5A:
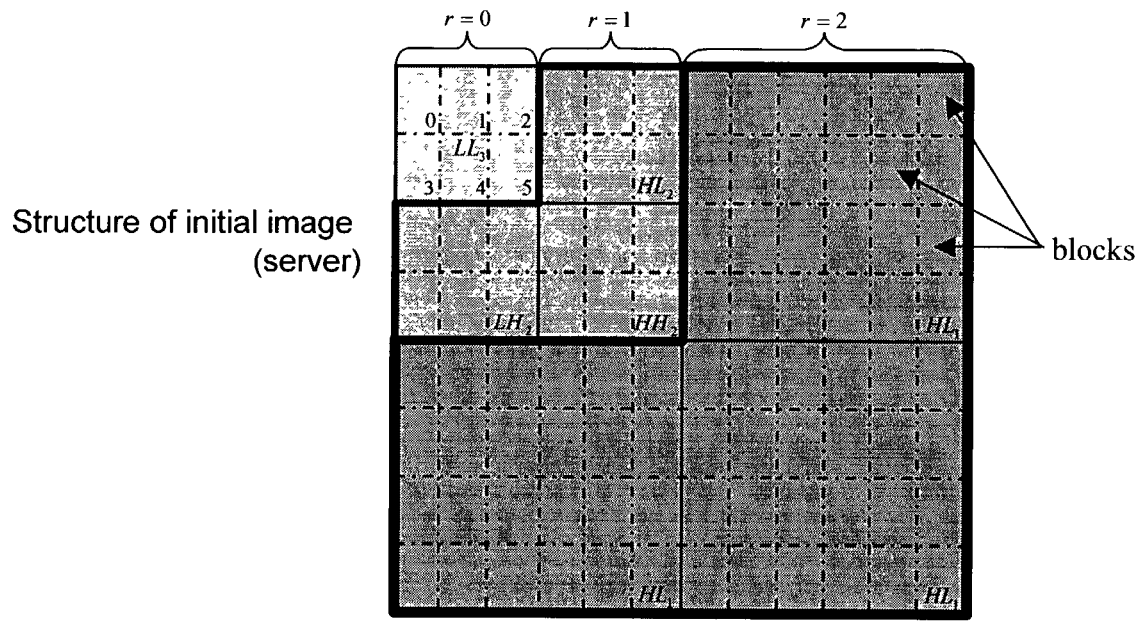
FIG. 5a depicts the blocks of data structure according to different resolutions of a compressed image signal available at the server of FIG. 2.

FIG. 5a also provides such a representation of the compressed digital signal.

The compressed signal thus has, in addition to the main header, for each tile in question, a tile header and, for each packet in question, a packet header.

The main header and the header of each tile contain information representing the structure of the compressed signal and the organization of the data in said signal.

The information is, non-exhaustively:
  information concerning the size of the image, namely its width and height, and the position of the image in a reference frame,
  information concerning the tiles, namely their number, width, height and position in the aforementioned reference frame,
  the number of resolution levels,
  the number of components,
  information on the compression of the data, namely the type of transformation envisaged (e.g. discrete wavelet transforms etc), the particularities of the quantization operation (e.g. the quantization pitch etc), the type of coding used (e.g. arithmetic coding etc),
  the presence of any regions of interest (ROIs),

.
.
.

FIG. 2a depicts highly schematically a communication architecture of the client-server type in which the invention can advantageously be implemented.

The server 30 is for example a computer and the client device 32 a microcomputer, a digital photographic apparatus, a mobile phone, a personal assistant of the PDA type ("Personal Digital Assistant") etc.

A communication network 34, for example of the cabled or radio type, connects the client device, constituting a first communication apparatus, to the server, which constitutes a second communication apparatus.

In this architecture, the compressed digital image signal described above is stored in the server 30 and the remote client device 32 will seek to obtain information from the server in order to form a digital signal derived from the compressed signal stored on the server.

The compression device 2 of FIG. 1 can for example be integrated into the server or only connected to it, or connected to the latter by another communication network.

However, the invention is not limited to this application and the device for forming a derived digital signal may, for example, be implemented in a data processing apparatus (microcomputer, digital photographic apparatus, camcorder etc) which itself stores the compressed image signal.

Figure 3:
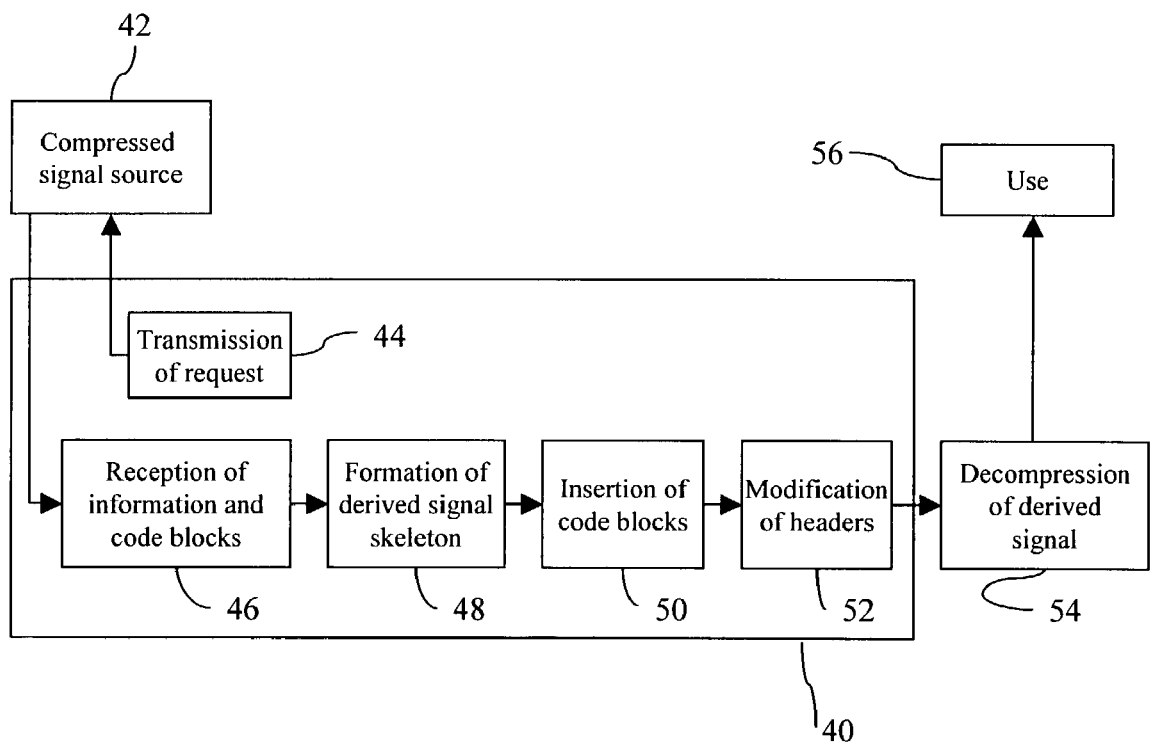
FIG. 3 depicts schematically a device for forming a derived digital signal according to the invention.

FIG. 3 depicts a device 40 for forming a derived signal according to the invention from a source 42 of the compressed signal previously described and being able to be obtained by the compression device 2 of FIG. 1.

Figure 2:
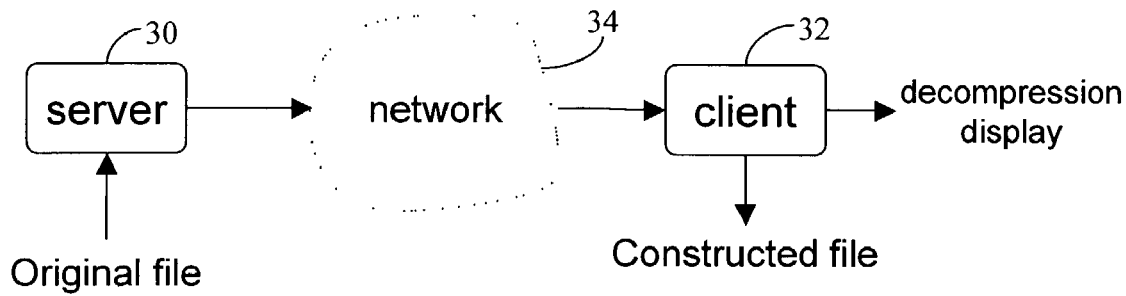
FIG. 2 depicts schematically a communication architecture of the client-server type in which the invention can be implemented.

The device 40 can, for example, be integrated into the client device 32 of FIG. 2 or connected to it.

The device 40 has a circuit 44 for transmitting a request aimed at obtaining from the source 42 the information contained in the compressed signal and which represent its structure and the organization of the data in this signal.

In accordance with this request, the source of the compressed signal 42 transmits the requested information to the device 40, which receives it in a reception circuit 46.

Once received and analyzed, this information enables a circuit 48 connected at the output of the circuit 46 to form a skeleton of a digital signal known as the derived signal and which is in accordance with a description syntax of the compressed signal.

The skeleton thus formed and stored contains the aforementioned information obtained from the compressed signal which is, for example, present in one or more headers.

It should be noted that the formation of the skeleton may take place whilst no block of compressed data has been received or when the compressed signal is currently being transmitted, or even entirely received.

The skeleton also has a body which will contain compressed blocks of data, once these have been obtained and inserted in said skeleton.

Figure 8:
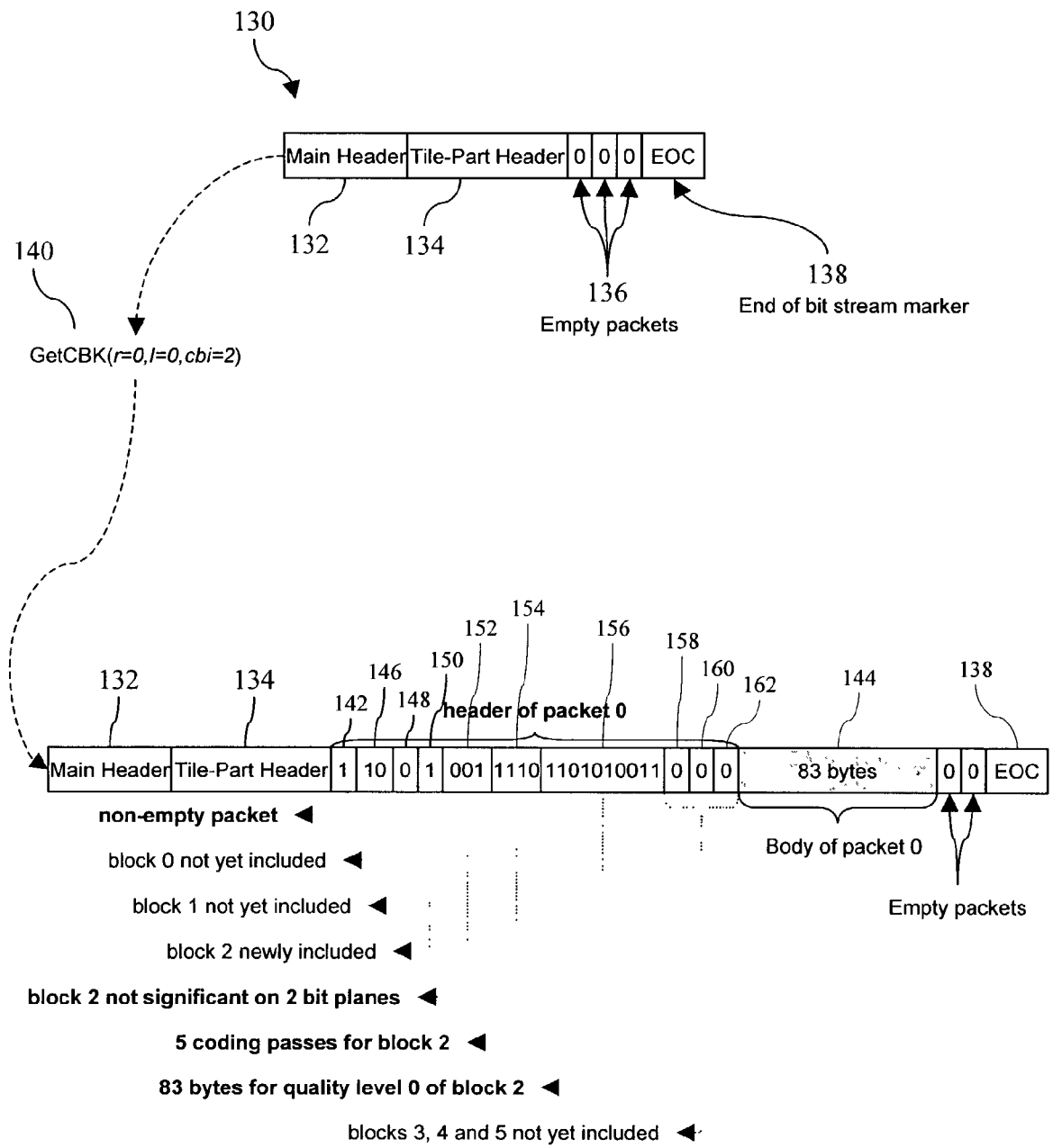
FIG. 8 illustrates on the one hand the formation of the skeleton of the derived signal and on the other hand the formation of said signal when a block of data is inserted.

This skeleton, depicted schematically in FIG. 8, through its structure, is immediately able to be decompressed although it does not yet contain any compressed blocks of data.

Thus, if the compressed image signal is in accordance with JPEG2000 standard, the skeleton of the derived signal thus formed is immediately able to be processed as a signal in accordance with the JPEG2000 compressed description syntax As soon as the skeleton is formed, a circuit 50 connected at the output of the circuit 48 inserts compressed blocks of data in the body of the skeleton.

The compressed blocks of data are obtained from the compressed signal stored in the source 42.

However, it should be noted that several cases may arise.

If the case of the client-server architecture of FIG. 2 is taken, the following scenarios can be envisaged:

1) The block of datas were requested during the transmission of a request established by the circuit 44.

The blocks received can be inserted by the circuit 50 as they are obtained or after a predetermined interval of time.

When a request for obtaining blocks is transmitted to the server, this request may concern either all the blocks of data of the compressed signal or only some of them.

In the latter case, the relevant part of the blocks of data of the compressed image signal corresponds to a sub-image thereof. Let it be assumed that, for the image, there are three resolution levels 0, 1 and 2 and three quality levels available, and that the user is interested in a sub-image of resolution 2.

In this case, the data contributing to each resolution level are grouped together in three data packets.

If the user is interested in the minimum quality level, according to the prior art it is necessary to obtain data packets P(0, 0), P(1, 0) and P(2,0) and, if the user requires the maximum quality, it is then necessary to obtain the packets P(0, 0), P(1, 0), P(2,0), P(0, 1), P(1, 1), P(2,1) and P(0, 2), P(1, 2) and P(2,2).

On the other hand, the invention makes it possible to obtain only the compressed blocks of data corresponding spatially to the sub-image requested and the required quality for a requested resolution.

2) The blocks of data are transmitted with the compressed digital signal from the server 30 to the device 40 associated with the device 32 of FIG. 2, without a specific request for obtaining blocks being transmitted.

The blocks received are inserted by the circuit 50 as they are obtained or after a predetermined interval of time.

3) It is also possible to conceive that the compressed digital signal containing the blocks of data be transmitted from the server 30 to the device 32 of FIG. 2 and that the latter constitutes the compressed signal source 42 of FIG. 3.

In this case, the circuit 44 transmits a request for obtaining all the available blocks to the source 42 or only some of them.

After reception by the circuit 46, the block or blocks received are inserted in the body of the skeleton by the insertion circuit 50, as soon as they are obtained or after a predetermined interval of time.

Figure 6:
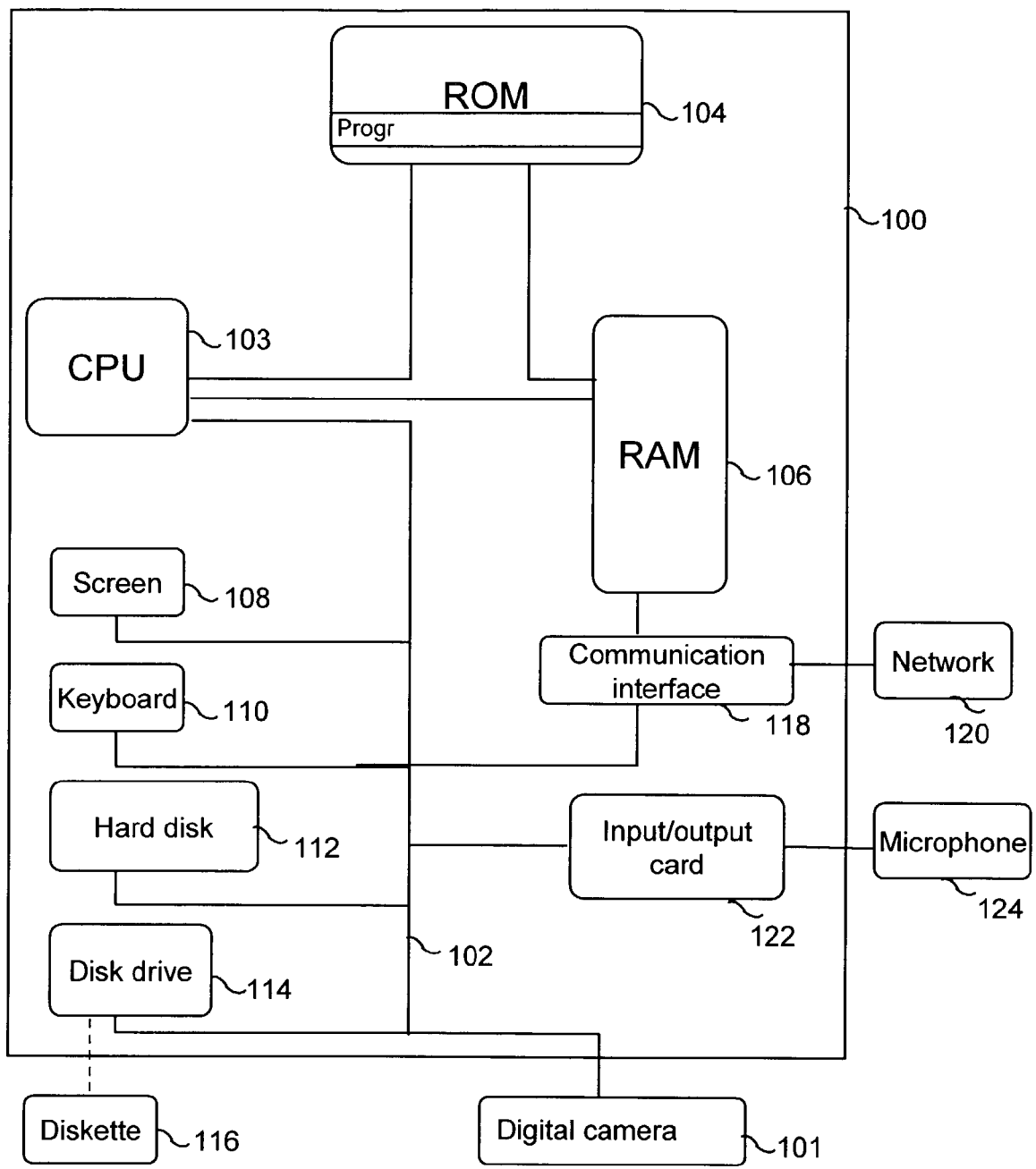
FIG. 6 is an embodiment of a programmable apparatus implementing the invention.

It should be noted that, when the compressed signal source 42 and the device 40 of FIG. 3 are in one and the same data processing apparatus, like the one in FIG. 6, requests for obtaining information necessary to the formation of the skeleton and compressed blocks of data are despite everything transmitted to the internal source 42 of the apparatus.

In such a case, everything stated at points 1) to 3) above remains valid.

It should be noted that the request to obtain information necessary to the formation of the skeleton can also include, in some cases, the request to obtain all the blocks of the signal or only some of them.

However, in the case disclosed at point 3), the use of requests is not always necessary.

This is because a data processing application may for example extract data from a file containing all or part of the compressed digital signal and form a derived digital signal from these data.

Returning to FIG. 3, the insertion circuit 50 inserts the block of data or blocks obtained in the body of the skeleton taking account of the order which was allocated to each block in the compressed signal, this order being obtained by the circuit 46 with the corresponding block.

A header modification circuit 52 is connected at the output of the circuit 50 and carries out a modification of a header of the skeleton according to the insertion of a compressed block of data in the body of the skeleton.

Figure 4:
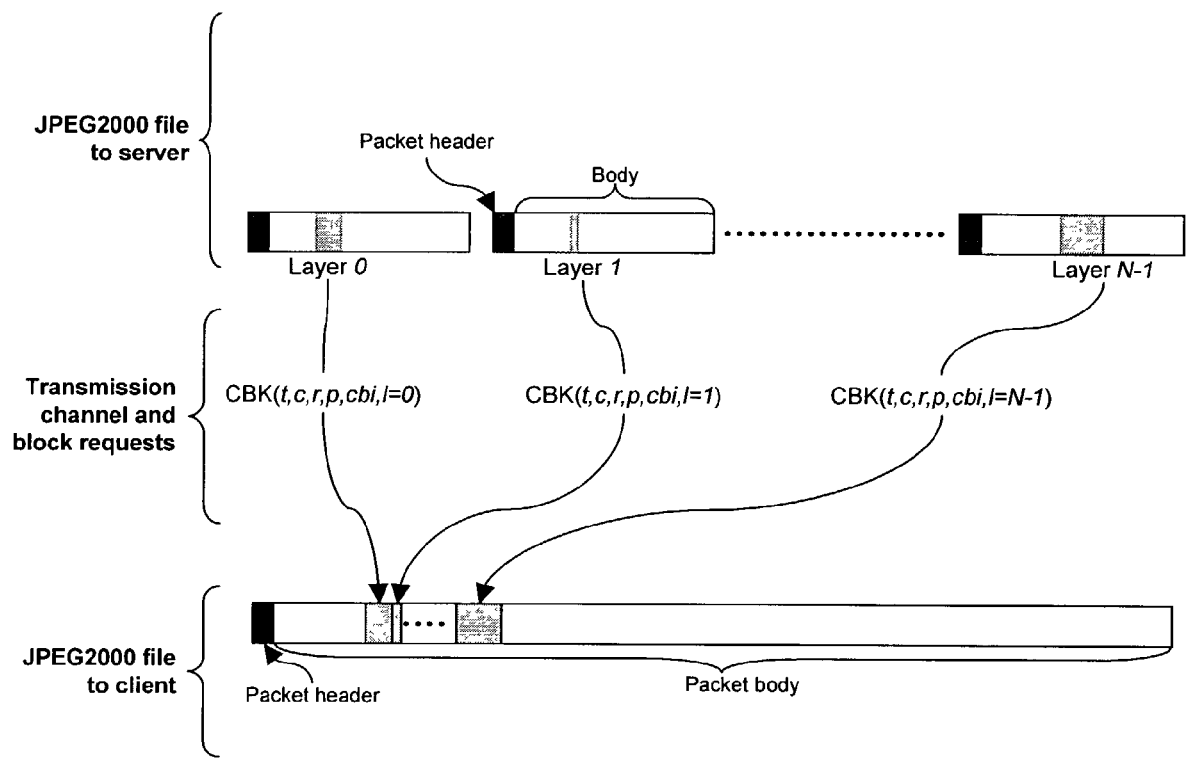
FIG. 4 illustrates the mechanism of recovering blocks of data contributing to a given resolution and their insertion in the skeleton of the derived signal.

FIG. 4 illustrates the transmission of requests to obtain compressed blocks of data belonging, in the compressed digital signal, to N data packets which correspond to the tile t, the component c, the resolution r and the precinct p and for all the quality levels or layers 0 to N−1.

As this figure illustrates, the invention makes provision for extracting the layer from the compressed block of data contributing in the first packet to the quality level 0 and so on, by increasing order of quality level, as far as the layer of this block contributing in the Nth packet to the quality level N−1.

It should be noted that the blocks could also have been compressed according to a single quality level.

The invention next makes provision for inserting each of these quality layers of the blocks in the body of a single packet, in increasing order of their respective quality levels and according to a single quality level.

It should be noted that having a single quality level in the reconstituted signal makes it possible to simplify the updating of the packet header as a block of data is inserted, as will be seen subsequently.

FIG. 4 also shows the header of the packet which is modified by the circuit 52 of FIG. 3 according to the block inserted in the body of the packet.

Even if all the data are stored in the same packet for a given resolution, it is despite everything possible to decompress this packet partially according to one or more selected blocks of data.

FIG. 5a depicts a compressed image signal with a single tile, decomposed into different frequency sub-bands according to three resolution levels and two quality levels, each sub-band being partitioned into blocks of data.

The blocks of data of resolution level 0 have been numbered from 0 to 5 for the remainder of the description given with reference to FIGS. 9a et seq.

It should be noted here that the sub-bands are not partitioned into precincts.

Figure 5B:
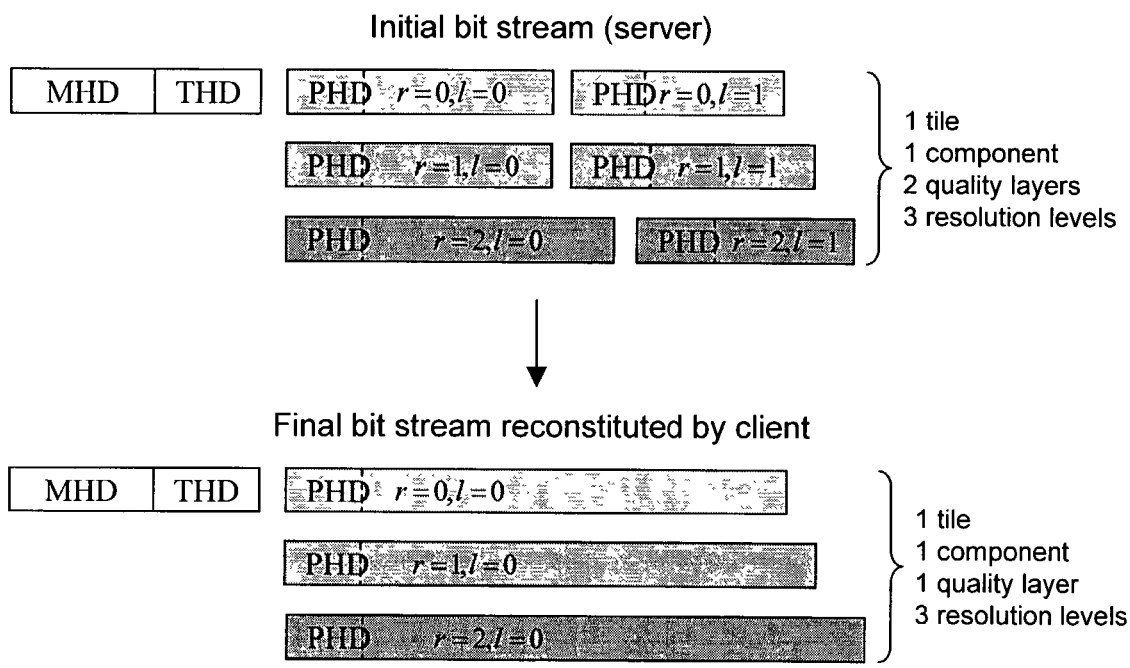
FIG. 5b depicts respectively the structure of the bit stream of the compressed signal at the server and in the client device of FIG. 2.

FIG. 5b depicts on the one hand the structure of the compressed digital image signal, of FIG. 5a, for example in the server 30 of FIG. 2, and on the other hand the structure of the derived digital image signal, for example in the device 32 of FIG. 2.

The main header of the signal, the tile header and the header of each packet will respectively be denoted MHD, THD and PHD.

The structure of the file associated with the compressed image signal of FIG. 5a comprises six packets, one per resolution level and quality level.

The structure of the file formed in the client device comprises for its part one packet per resolution level, that is to say three packets.

Returning to FIG. 3, at the output from the circuit 52 a unit 54 carries out a decompression of the derived digital signal which was formed by the device 40.

The unit 54 overall performs operations which are the reverse of those provided for in the compression device 2 of FIG. 1.

The decompressed signal coming from the unit 54 is then transmitted to the user unit 46 which, for example, in the case of an image signal, is a display screen.

It should be noted that the device 40 could also include the decompression unit 54 without this affecting the principle of the invention.

It should be noted that the invention can also apply to other compressed digital signals such as, for example, sound signals or video signals or else, non-exclusively, signals coming from a facsimile machine etc.

With reference to FIG. 6, an example is described of a programmable apparatus 100 implementing the invention. This apparatus is adapted to process a compressed digital signal or information and data coming from this signal.

According to the chosen embodiment depicted in FIG. 3, an apparatus implementing the invention is for example a microcomputer 100 connected to different peripherals, for example a digital camera 101 (or a scanner, or any image acquisition or storage means) connected to a graphics card and providing data to be decoded.

The apparatus 100 includes a communication bus 102 to which there are connected:
  a central unit 103 (a microprocessor),
  a read only memory 104, containing a program "Progr",
  a random access memory 106, containing registers adapted to record variables modified during the execution of the aforementioned program,
  a screen 108 for displaying the data to be decompressed or serving as an interface with the user, who can parameterize certain modes of the online storage system ("caching") according to the invention, using a keyboard 110 or any other means, such as for example a mouse,
  a hard disk 112, a disk drive 114 adapted to receive a diskette 116, an interface 118 for communication with a communication network 120 able to transmit digital data to be compressed or to receive compressed data which are to be processed by the apparatus or to transmit the data compressed and processed by the apparatus, an input/output card 122 connected to a microphone 124 (the data to be processed according to the invention then constitute an audio signal).

The communication bus affords communication between the different elements included in the microcomputer 100 or connected to it. The representation of the bus is not limitative and notably the central unit is able to communicate instructions to any element of the microcomputer 100 directly or by means of another element of the microcomputer 100.

The program denoted "Progr" enabling the programmable apparatus to implement the invention can be stored for example in read only memory 104 (referred to as ROM in the drawing) as depicted in FIG. 3.

Although only one program is identified, it is possible to have several programs or subprograms for implementing the invention.

According to one variant, the diskette 116, just like the hard disk 112, can contain compressed and stored data as well as the code of the invention which, once read by the apparatus 100, will be stored in the hard disk 112.

In a second variant, the program can be received and stored in an identical fashion to that described previously by means of the communication network 120.

The diskettes may be replaced by any information carrier such as, for example, a CD-ROM or a memory card. In general terms, an information storage means which can be read by a computer or by a microprocessor, integrated or not into the apparatus, possibly removable, stores a program implementing the method according to the invention.

In more general terms, the program can be loaded into one of the storage means of the apparatus 100 before being executed.

The central unit 103 will execute the instructions relating to the implementation of the invention, instructions stored in the read only memory 104 or in the other storage elements. On powering up, the on-line storage program or programs, which are stored in a non-volatile memory, for example the ROM memory 104, are transferred into the random access memory RAM 106, which will then contain the executable code of the invention, as well as registers for storing the variables necessary for implementing the invention.

It should be noted that the data processing apparatus including a derived digital signal formation device according to the invention can also be a programmed apparatus.

This apparatus then contains the code of the computer program or programs for example fixed in an application-specific integrated circuit (ASIC).

Figure 7:
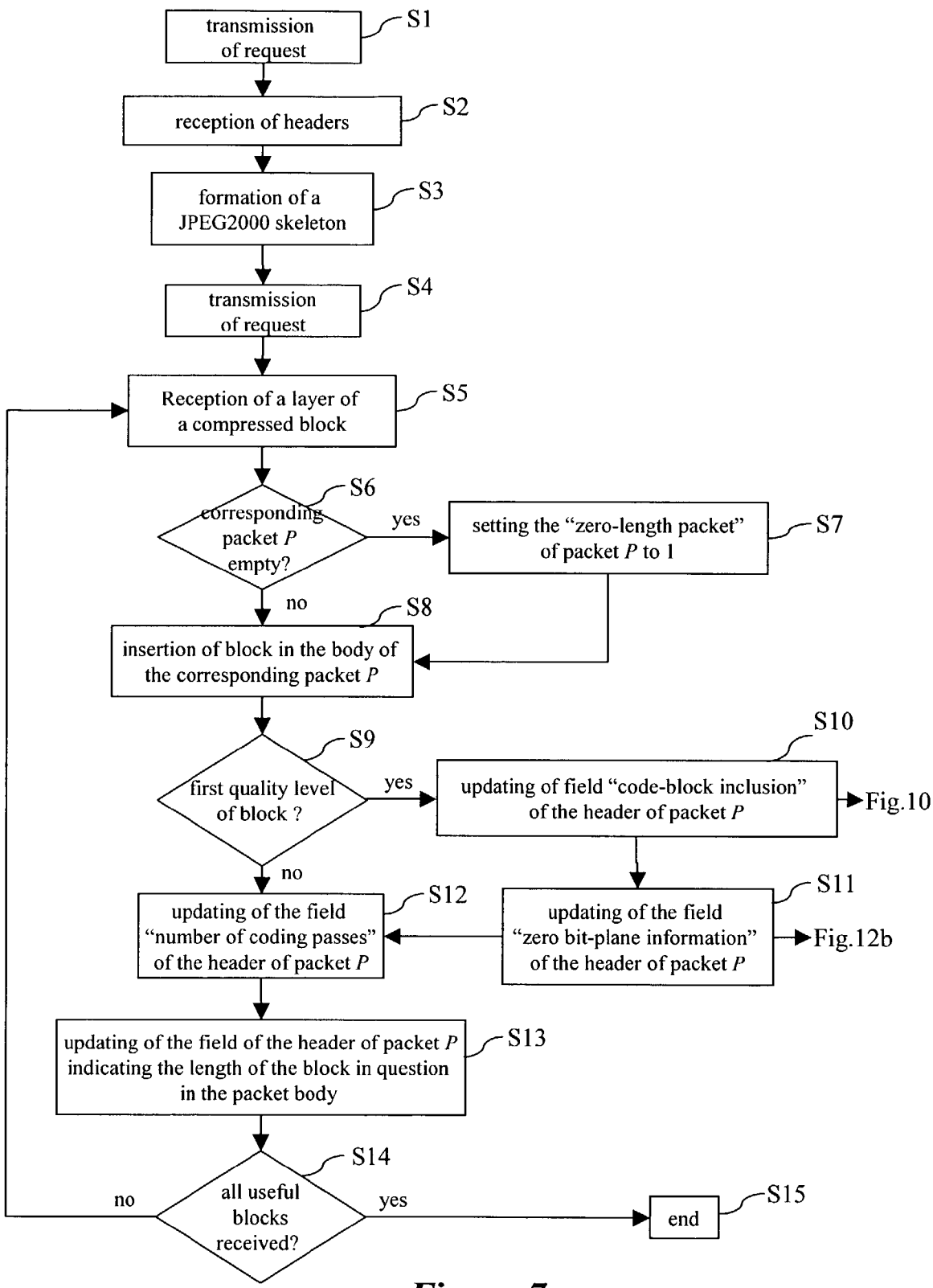
FIG. 7 is an algorithm comprising different steps of the method according to the invention.

FIG. 7 illustrates an algorithm containing different instructions or portions of software code corresponding to steps of the derived digital signal formation method according to the invention.

The computer program denoted "Progr" which is based on this algorithm is stored in the read only memory 104 of FIG. 6 and, on initialization of the system, is transferred into the random access memory 106.

It is then executed by the central unit 103, which thus makes it possible to implement the method according to the invention in the device of FIG. 6.

It should be noted that the device of FIG. 6 which contains the previously mentioned program Progr may, in the context of a communication architecture of the client-server type, be the device 32 of FIG. 2 pr a device associated with this device 32.

However, the device of FIG. 6 containing the previously mentioned program Progr can also be used outside a communication architecture of the client-server type and, in this case, it also includes the compressed digital signal in one of its storage means.

The algorithm of FIG. 7 includes a first step $S_1$ of transmitting a request to obtain information contained in the compressed digital signal and representing the structure of the signal and the organization of the data in it.

In the case of a communication architecture of the client-server type, this request is transmitted, by means of the communication network 34, to the server 30.

Apart from this case and, for example, as illustrated by FIG. 6, a request is transmitted to the source of the compressed digital signal which is present in the apparatus of FIG. 6.

During the following step $S_2$ of the algorithm, following on from the transmission of a request, the method makes provision for receiving the requested information contained in the main header and the tile headers of the compressed digital signal, as well as in the packet headers.

Step $S_2$ is followed by step $S_3$ using the aforementioned information obtained during step $S_2$ in order to form a skeleton or template of a digital signal derived from the compressed digital signal.

The skeleton thus formed 130 (FIG. 8) is in accordance with a description syntax of the compressed signal and includes a main header 132, a tile header 134 corresponding to the single tile of the compressed image signal and a set of empty packets 136 constituting the body of the skeleton, as well as a bit stream end marker 138 EOC.

The empty packets are intended to subsequently contain compressed blocks of data once these have been obtained from the compressed digital signal.

It should be noted that the number of empty packets per tile is derived from the number of components, resolution levels and precincts present in each of the tiles, if there are several tiles.

It should be noted that the main header 132 and the tile header 134 of the skeleton contain information contained in the main header and the tile header of the compressed image signal.

Step $S_3$ of the algorithm in FIG. 7 is followed by step $S_4$ during which a request to obtain at least one compressed block of data is transmitted.

The remarks concerning the transmission step $S_1$ remain valid for step $S_4$.

It should be noted however that step $S_4$ can be performed during step $S_1$ and can include a request to obtain several compressed blocks of data.

The request transmitted at step $S_4$ is illustrated in FIG. 8 by the reference 140.

The following step denoted $S_5$ is a step of receiving a layer of a compressed block of data cbi.

In our example, the compressed block of data received is the third block (index 2) corresponding to resolution 0 and to the quality layer or level 0 (CBK (r=0, 1=0, cbi=2)).

Step $S_5$ is followed by a step $S_6$ during which a test is carried out in order to seek the corresponding packet P in the bit stream of the derived digital signal currently being formed and to determine whether this packet is, empty.

In the affirmative, step $S_6$ is followed by a step $S_7$ during which the value of the "zero-length packet" bit indicating that the packet is empty changes from 0 to 1, as indicated by the field 142 of the header of the first packet of the derived signal.

Following on from this step $S_7$, the following step $S_8$ makes provision for inserting the layer of the received block of data in the body of the corresponding packet P.

If it is assumed that the layer 0 of the received block of data is 83 bytes long, then the body of this packet illustrated by the reference 144 is filled accordingly.

It should be noted that the position at which the received block of data is inserted in the packet body depends on the one hand on the index of the block of data (the blocks of data follow each other in increasing order of their index) and on the other hand the number of the quality layer to which this block of data contributes.

It should be noted that since one and the same compressed block of data contributes to several different quality layers or levels, these different contributions or layers should preferably be received in increasing order of quality level, in order to enable the user to correctly restore the compressed data received.

The following steps of the algorithm in FIG. 7 concern the updating of the header of the data packet P concerned, which takes place in order to make the header consistent with the body of this packet which was modified by the insertion of compressed blocks of data.

Some of these steps will be applied to fields of the header of the packet concerned, which appear in FIG. 8.

The field "block of data inclusion information" draws up a list of the blocks of data present and absent in the bit stream currently being constructed. More particularly, this field comprises the sub-fields referenced 146, 148, 150, 158, 160 and 162 of the derived signal depicted in FIG. 8.

A field denoted 152 "zero-bit plane information" indicates that the block of data of index 2 is insignificant on two bit planes. This information is known during the reception of information indicated at step $S_2$ referred to above.

Another field denoted 154 "number of coding passes" indicates the number of coding passes contained in the compressed block of data which was inserted in the body of the packet in question.

The last field denoted 156 concerning the compressed block of data of index 2 indicates the length of the contribution of this block of data to the current packet body.

It should be: noted that the following fields 158, 160 and 162 indicate respectively that the compressed blocks of data of index 3, 4 and 5 have not yet been inserted in the body of the packet.

Returning to the algorithm in FIG. 7, the previously described step $S_8$ is followed by a step $S_9$ during which a test is carried out on the layer of the compressed block of data received in order to determine whether this block appears for the first time in the body of the packet.

In the affirmative, step $S_9$ is followed by step $S_{10}$ during which the block of data inclusion information field of the header of the packet P is updated in order to indicate that the compressed block of data in question is now present in the body of the packet.

This updating will be described in more detail later with reference to the algorithm in FIG. 10.

Step $S_{10}$ is followed by a step $S_{11}$ during which the zero bit-plane information field, denoted 152, of the header of the packet P is updated. This field indicates the respective numbers of most significant bit planes for which the blocks present in a packet are insignificant.

This updating will be described more particularly later with reference to the algorithm in FIG. 12b.

The updating of the header of the packet P continues with the following step $S_{12}$, which is common to the compressed blocks of data appearing for the first time in the body of the packet and to those which are already present therein.

During this step, the field of the number of coding passes 154 of the header of the packet P is updated.

More particularly, as soon as a new layer of a compressed block of data is received, the total number of coding passes for the block of data in question increases.

In the context of JPEG2000 standard, a binary word with a variable length associated with each of the possible values of the number of coding passes is defined.

According to this standard, it suffices to calculate the new number of coding passes for the block of data in question and to replace the old code with the code defined by this standard and which corresponds to the new number of coding passes of the block of data being processed.

Thus the updating of the field of the number of coding passes is performed very simply.

Step $S_{12}$ is followed by a step $S_{13}$ during which the length of the block of data in question in the body of the packet and which is supplied by the field 156 of FIG. 8 is updated.

The length of the field 156 is a binary word of length in bits equal to $L_{block}+\lfloor \log_2$ (number of coding passes)$\rfloor$, where $L_{block}$ is a state variable associated with the block of data in question and whose initial value is positioned at 3.

The length in bytes of the contribution of the block of data to the body of the packet is preceded by bits signaling an increase in the value of $L_{block}$.

In the example in FIG. 8, two "1" and "0" indicate: that $L_{block}$ increases by 2: $L_{block}=5$.

The length of the block of data is therefore coded over a number of bits equal to $5+\lfloor \log_2(5) \rfloor=7$, which is the number of bits necessary for coding the value 83.

In other words, each time a layer of the block of data is received, the total length of the block of data in the body is recalculated, as well as the number of bits necessary for coding it.

This then supplies the new value of $L_{block}$ from the new number of coding passes for the current block of data.

A new binary word indicating the value of $L_{block}$ and the number of bytes in the block of data is formed and replaces the old binary word of the field processed.

Step $S_{13}$ is followed by a step $S_{14}$ during which a test is carried out in order to determine whether all the compressed block of datas required and constituting, for example, a part of the compressed digital signal requested by the user are received.

In the case of a compressed digital image signal, the part in question corresponds to a sub-image.

When not all the blocks have been received, then step $S_{14}$ is followed by the previously described step $S_5$ and the process of receiving the required blocks of data which have not been received and the insertion thereof in the derived digital signal continues until step $S_{14}$ leads to step $S_{15}$, ending the algorithm in FIG. 7.

The circuit 52 modifying the header of FIG. 2 carries out the operations indicated at steps $S_7$, $S_{10}$, $S_{11}$, $S_{12}$ and $S_{13}$ in FIG. 7.

To this end, the circuit 52 includes more particularly:
means of updating the field 142 ("zero length packet") of the header of the packet in question as soon as the packet becomes non-empty;
means of updating the field consisting of the sub-fields 146, 148, 150, 158, 160 and 162 ("block of data inclusion information") of the header of the packet in question when a compressed block of data appears for the first time in the body of the packet;

means of updating the field 152 ("zero bit-plane information") of the header of the packet in question when a compressed block of data appears for the first time in the body of the packet;

means of updating the field 154 ("number of coding passes") of the header of the packet in question when a new contribution (portion) of a compressed block of data is inserted in the body of the packet;

means of updating the field 156 of the header of the packet indicating the length of the contribution of the block of data in question to the body of the packet.

FIGS. 9a and 9b illustrate the mechanism of updating the information of the field "block of data inclusion information" contained in the sub-fields 146, 148, 150, 158, 160 and 162 of each packet header, as blocks of data are received.

This field is responsible for indicating the blocks of data which contribute to the body of the packet in question.

The updating of this field uses an identification tree or tag tree, which is constructed from compressed blocks of data representing the leaves of the tree.

In order to understand the concept of tag tree, consider the set of blocks of data of resolution level 0 in FIG. 5a whilst allocating to them, as depicted in FIG. 9a, one value per block (leaf), that is to say the values 0, 0, 2, 2, 1, 1 for the respective blocks 0, 1, 2, 3, 4, 5.

The value allocated to each leaf is equal to the number of the quality layer in which the corresponding block appears for the first time.

To code these values, they are grouped together in fours and thus two nodes are obtained in the middle of FIG. 9a.

The value allocated to each node in the tree is therefore equal to the minimum of the values of its descendants.

The value of the root of the tree depicted on the right-hand side in FIG. 9a is coded by a series of k "0"s ending in a "1", indicating that it is greater than 0 by k units.

Likewise, each node is then coded with respect to the value of the parent node, by a series of k "0"s ending in a "1", indicating that the current node is greater than the parent node by k units.

It is therefore a question, as blocks are inserted in the packets of the derived signal currently being formed, of updating the coding of the tag tree indicating the blocks included in each packet.

Given the structure at a single quality layer of the file constructed by the device according to the invention, the values of the leaves on the tree used will be either zero (block received) or greater than 0 (block not received).

This property makes the process of updating the block inclusion information very simple.

In fact, consider the example of the requests for transmission of blocks in the table in FIG. 9b (1$^{st}$ column).

On reception of the first block, a partial code is generated for each block, indicating whether or not it is included in the current packet (2$_{nd}$ column).

The first code indicates that the leaf corresponding to block 0 has a value greater than or equal to 1, that is to say block 0 is not included in the layer of index 0 of the bit stream currently being formed.

Thus, for the following blocks, a "0" indicates that they are not present in the layer 0, and a "1" indicates that they appear in this layer.

In this table, the tag tree for the blocks included in the third column has also been depicted in another form.

It should be noted that only the information necessary for knowing the inclusion of a block in the current layer is coded in the header of the packet.

Thus no information is necessary for indicating that the block 5 does not belong to the current layer 0, the bit "0" for the block 2 indicating that the parent node of blocks 2 and 5 has a value greater than or equal to 1.

On the other hand, on reception of the block 5 (4$^{th}$ line in the table), the codes of blocks 2 and 5 change, in order to indicate the non-inclusion of the block 2 and the inclusion of block 5 in the current layer.

When a new compressed block of data appears in the packet, in accordance with step $S_{10}$ of FIG. 7, an updating of the field "block of data inclusion information" of the packet header is carried out.

More particularly, an algorithm for updating the aforementioned tag tree is executed.

Figure 10:
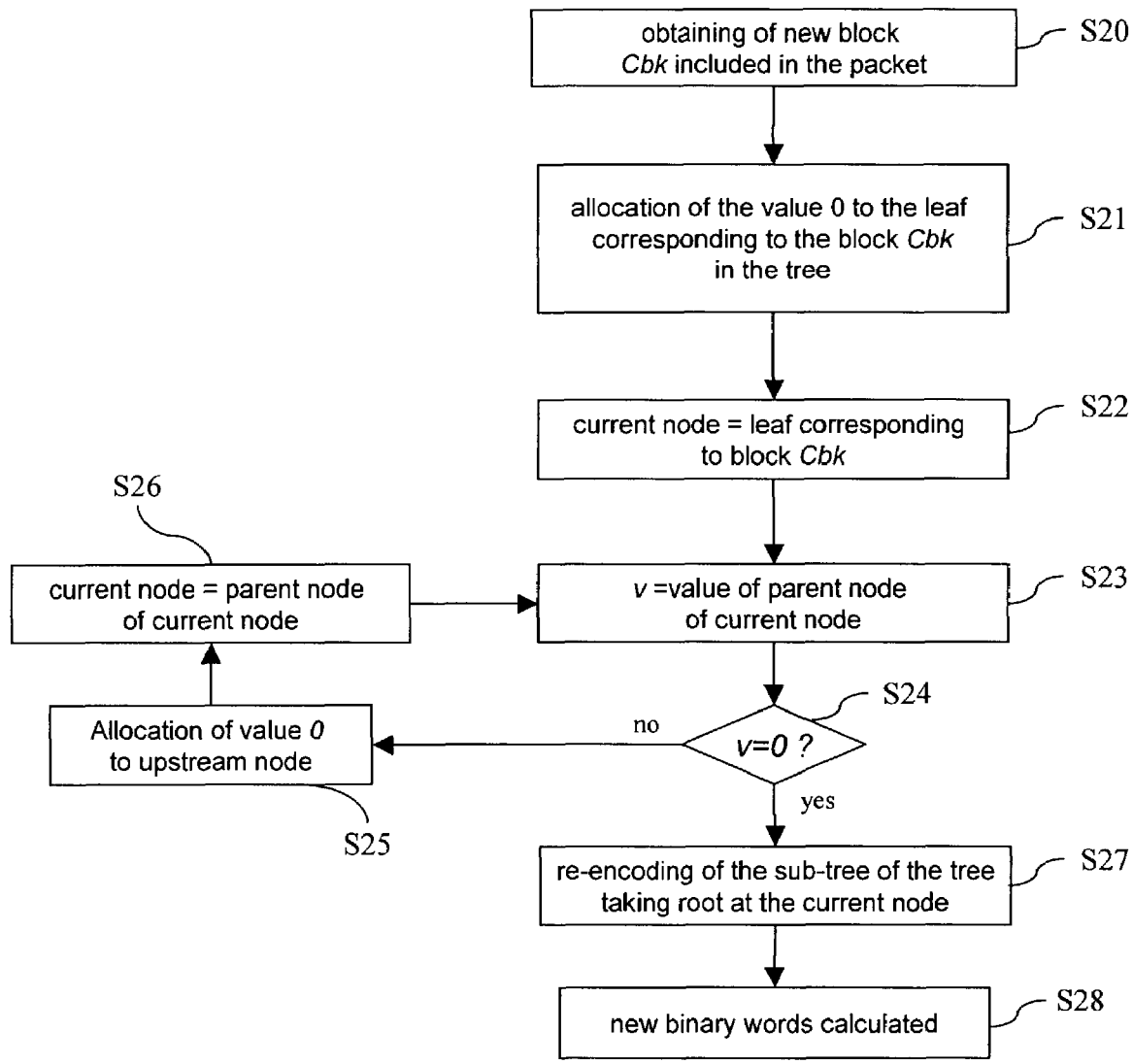

FIG. 10 also illustrates this algorithm, which includes different instructions or portions of software code corresponding to steps of the method of updating the tag tree constructed in order to indicate the inclusion of each block in a data packet.

A first step $S_{20}$ consists of obtaining a new block Cbk which has been inserted in the packet.

The following step $S_{21}$ consists of allocating the value 0 to the leaf corresponding to the block Cbk in the tag tree, the value 0 corresponding to the index of the quality layer of the packet.

The following step $S_{22}$ makes provision for considering the current node as being the leaf corresponding to the block Cbk.

During the following step $S_{23}$, the value v of the parent node of the current node is determined and, during the following step $S_{24}$, a test is carried out in order to determine whether this value is zero.

In the negative, during the following step $S_{25}$, the value 0 is allocated to the node situated upstream of the leaf being processed.

The following step $S_{26}$ consists of considering that the current node is the parent node of the current node and then the previously described step $S_{23}$ is once again executed.

It can be seen that a propagation process consisting of updating all the nodes disposed upstream of the leaf processed whose value is greater than 0 is thus effected.

However, this updating of the values of the nodes upstream modifies the coding of the tag tree.

For this reason, step $S_{24}$, when it leads to a positive result, is followed by a step $S_{27}$ during which a new coding of the sub-tree of the tag tree whose root corresponds to the modified node furthest upstream in the tag tree is carried out.

Next, step $S_{28}$ makes provision for suitably placing in the header of the packet in question the new binary words which have just been determined and which are associated with the leaves of the newly coded sub-tree. This step ends the algorithm for updating the tag tree.

It will be noted that the computer program or subprogram based on this algorithm is stored in the read only memory 104 of FIG. 6 and, on initialization of the system, is transferred into the random access memory 106.

It is then executed by the central unit 103, which thus makes it possible to implement the method in the device of FIG. 6.

It will be noted that this program is considered as forming part of the program "Progr" depicted in FIG. 6.

However, it may also be a separate program.

As has just been seen, when the bit stream currently being formed is formed by a single quality layer, the codes of the tag tree updated are copied as they are into the header of the modified packet.

On the other hand, if the bit stream of the derived digital signal were formed on several quality layers, the introduction of a compressed block of data into the body of this signal would be accompanied by the modification of the coding of the tag tree in many packets of this signal.

Figure 11A:
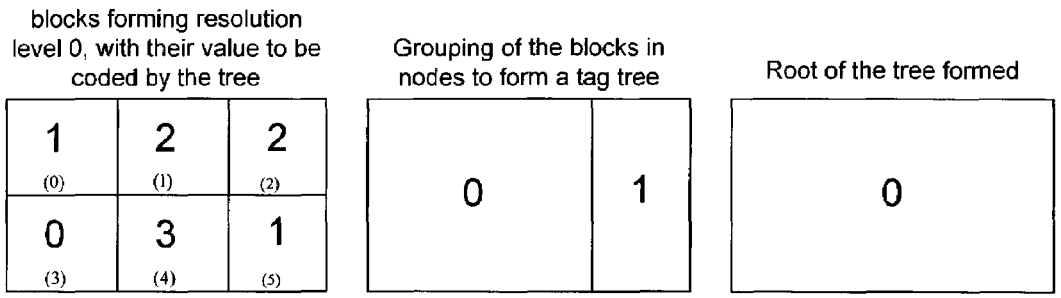
FIG. 11a illustrates the construction of a tag tree for indicating the number of bit planes on which each block of data is insignificant.
Figure 11B:
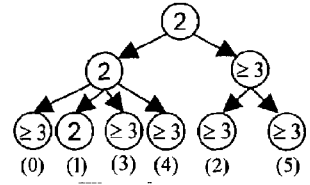
FIG. 11b is a table giving the main steps of constructing and updating the tag tree of FIG. 11a according to the obtaining of different blocks.

FIGS. 11a and 11b illustrate the mechanism of updating the information contained in the field 152 of each packet header of the skeleton 130 of the derived signal of FIG. 8.

Once again, the values of the numbers of most significant bit planes of the field 152 are coded by means of another tag tree.

The table in FIG. 11b shows that, unlike the block inclusion information, the field 152 "zero bit-plane information" is present in the header of the packet only for the blocks already received by the user.

In addition, as shown by the table, the inclusion of a new block can modify the codes of the identification tree of several other blocks already present in the packet concerned.

The process of updating these codes is slightly more complex than that concerning the inclusion information of the blocks in FIGS. 9a, 9b and 10.

In a similar fashion to the description given with reference to FIG. 9a for producing the first tag tree, the blocks of data of resolution level 0 denoted 0, 1, 2, 3, 4 and 5 are leaves of the tree to which there are allocated respectively the values 1, 2, 2, 0, 3 and 1 (left-hand representation in FIG. 11a).

Still in a similar fashion, the values to be coded are grouped together in fours, thus forming two nodes whose values are 0 and 1 (the representation in the middle).

Likewise, the root of the tree formed (the representation on the right) is coded by the value 0.

The table in FIG. 11b is then constructed just like the corresponding tag tree, according to the obtaining of the different compressed block of datas indicated in the first column.

Thus, following on from the reception of the block of index 1 for resolution level 0, the value 00111 is allocated to the corresponding leaf in the tag tree.

After reception of the block of index 3, the value 1 is allocated to the corresponding leaf, whilst the value of the leaf which corresponds to the block of index 1 becomes 11001.

It will be noted that the third column indicates the corresponding modifications of the values of the leaves, nodes and root of the tag tree.

The updating of the field 152 will be returned to in the following description of FIGS. 12a and 12b.

FIG. 12a illustrates the example of the inclusion of a block which causes the change in the coding of several leaves of the tag tree used for coding the field 152 "zero bit-plane information", of the header of a packet.

This example is shown on the second line, in the third column of the table in FIG. 11b.

FIG. 12a shows that the new value of the leaf can give rise to the modification of one or more nodes situated upstream of the leaf in question.

This then modifies the coding of the leaves of a sub-tree which takes its root at the node situated furthest upstream.

This sub-tree is surrounded by dotted lines in FIG. 12a.

As is clear in this Figure, the node furthest upstream is affected by the modification of the leaf corresponding to the block of index 3 newly included (the second line in the table in FIG. 11b).

It is therefore necessary to code the whole of the sub-tree in question once again, and to substitute the new codes of the identification tree allocated to its leaves in the header of the packet being processed.

The algorithm for updating the tag tree and a new coding of part of this tree is detailed with reference to FIG. 12b.

FIG. 12b illustrates the algorithm which includes different instructions or portions of software code corresponding to steps of the method of updating the tag tree constructed in order to indicate the number of bit planes on which each of the blocks is insignificant.

It should be noted that the computer program or subprogram based on this algorithm is stored in the read only memory 104 of FIG. 6 and, on initialization of the system, is transferred into the random access memory 106.

It is then executed by the central unit 103, which thus makes it possible to implement the method in the device of FIG. 6.

It should be noted that this program is considered as forming part of the program "Progr" depicted in FIG. 6.

However, it may also be a separate program.

A first step $S_{30}$ of the algorithm consists of obtaining a new block Cbk which has not yet been inserted in the packet for which it is intended.

The following step $S_{31}$ consists of adding the aforementioned block Cbk in the tag tree currently being updated.

During the following step $S_{32}$, the number v of most significant bit planes on which the block Cbk is insignificant is allocated to the leaf which corresponds to the block Cbk in the tag tree constructed.

During the following step denoted $S_{33}$, the value of the node situated upstream of the current node in the tag tree in question is determined, this value being denoted v'.

The following step $S_{34}$ is a test step during which a comparison is carried out between the values v and v'.

If the value v is less than the value v', then step $S_{34}$ is followed by a step $S_{35}$ during which the value v is allocated to the parent node (the node upstream of the current node).

The following step denoted $S_{36}$ consists of considering that the current node is the parent node of the current node and then the previously described step $S_{33}$ is once again executed.

Propagation is thus effected by following the value v back in the tree until a node is reached for which the value v' is less than or equal to the value v.

When this is the case, step $S_{34}$ is followed by a step $S_{37}$ during which a new coding is carried out of the sub-tree (the example of FIG. 12a) whose root corresponds to the modified node which is situated furthest upstream in the identification tree.

Next, the following step $S_{38}$ makes provision for suitably placing in the header of the packet in question the new binary words which have just been determined and which are associated with the leaves of the newly coded subtree.

This step ends the algorithm for updating the tag tree depicted in FIGS. 11a, 11b and 12a.

It should be noted that the invention makes it possible notably to store, on line, for example in a cache memory or in any storage peripheral, a derived digital signal (e.g. a derived image signal), as this signal is transmitted in elementary entities.

Thus having available the derived digital signal stored makes it possible to subsequently reuse this signal without needing to once again transmit at a distance the data which make it up.

This therefore procures a significant saving in time for the user and removes the risks of transmission error in the case of a new transmission.

This application is particularly useful when the user wishes to reuse a sub-image or area of interest of the image and the latter is stored on a server.

In addition, having available a derived digital signal stored in the same data processing apparatus as the one where the compressed original signal is stored is also advantageous.

This is notably the case when the derived digital signal which has been formed and stored represents what is of interest to the user in the compressed original signal. The user can therefore use it once again without having recourse to the compressed original signal, thus saving a significant amount of time.

In addition, when the compressed image signal is in accordance with a standard such as JREG2000, the invention makes it possible to progressively construct a derived signal which is constantly kept in conformity with this standard, as the compressed blocks of data are inserted in the signal.

The invention claimed is:

1. A method of forming a derived digital signal from a compressed digital signal which has been obtained by compressing an original digital signal including original data representing physical quantities and grouped together in blocks of data ordered in the original signal, said method comprising the steps of:
   obtaining information contained in the compressed digital signal and representing a structure of the signal and an organization of the data therein; and
   forming, from the information, a skeleton of the derived digital signal which at least partly includes the information and at least one header and one body intended to subsequently contain compressed blocks of data, the skeleton thus formed being in accordance with a description syntax of the compressed signal,
   said method further comprising the steps of:
   obtaining at least one block of data from the compressed digital signal; and
   inserting the block of data in the body of the skeleton of the derived digital signal.

2. A method according to claim 1, wherein the insertion of a block of data in the body of the skeleton of the derived digital signal is performed as soon as the block of data is obtained.

3. A method according to claim 1, wherein the block of data is obtained with the order allocated thereto in the compressed digital signal, and when the block is inserted in the body account is taken of the order.

4. A method according to claim 1, wherein at least one header of the skeleton of the derived digital signal includes information representing the compressed blocks of data contained in the body, said method further comprising the step of modifying the header according to the insertion of at least one block of data in the body.

5. A method according to claim 1, wherein the blocks of data of the original digital signal have been compressed according to at least one quality level, and the compressed blocks of data are organized in the body of the skeleton of the derived digital signal according to a single quality level.

6. A method according to claim 5, wherein, when each of the blocks of data of the original digital signal has been compressed according to several quality levels, the different quality layers constituting each of the compressed blocks of data are inserted in the body in increasing order of the quality levels.

7. A method according to claim 1, further comprising the step of constructing a tag tree of the block of data inserted in the body of the skeleton, the presence of the block of data being identified for each of them by a value of a code.

8. A method according to claim 7, further comprising the step of updating at least some of the coded values of the tag tree according to the insertion of a block of data in the body of the skeleton.

9. A method of forming a derived digital signal from a compressed digital signal which has been obtained by compressing an original digital signal including original data representing physical quantities and grouped together in blocks of data ordered in the original signal, said method comprising the steps of:
   obtaining information contained in the compressed digital signal and representing a structure of the signal and an organization of the data therein; and
   forming, from the information, a skeleton of the derived digital signal which at least partly includes the information and at least one header and one body intended to subsequently contain compressed blocks of data, the skeleton thus formed being in accordance with a description syntax of the compressed signal,
   wherein said step of forming a skeleton of the derived digital signal is performed in a first communication apparatus which communicates at a distance with a second communication apparatus in which the compressed digital signal is stored.

10. A method according to claim 9, wherein the step of forming the skeleton of the derived digital signal is performed while not all the data contained in the compressed digital signal has been received.

11. A method according to claim 9, further comprising the step of transmitting, to the second communication apparatus, a request for obtaining information contained in the compressed digital signal and representing the structure of the compressed signal and the organization of the dicta therein, prior to the step of obtaining the information.

12. A device for forming a derived digital signal from a compressed digital signal which has been obtained by compressing an original digital signal including original data representing physical quantities and grouped together in blocks of data ordered in the original signal, said device comprising:
   means of obtaining information contained in the compressed digital signal and representing a structure of the signal and an organization of the data therein;
   means of forming a skeleton of the derived digital signal from the information, and which at least partly contains the information and at least one header and one body intended to subsequently contain compressed blocks of data, the skeleton thus formed being in accordance with a description syntax of the compressed signal;
   means of obtaining at least one block of data from the compressed digital signal; and
   means of inserting the block of data in the body of the skeleton of the derived digital signal.

13. A device according to claim 12, wherein the block of data is obtained with the order allocated thereto in the compressed digital signal, and when the block inserted in the body account is taken of the order.

14. A device according to claim 12, wherein at least one header of the skeleton of the derived digital signal includes information representing the compressed blocks of data contained in the body, said device further comprising means of modifying the header according to the insertion of at least one block of data in the body.

15. A device according to claim 12, further comprising means of constructing a tag tree of the blocks of data inserted in the body of the skeleton, the presence of the blocks of data being identified for each of them by a value of a code.

16. A device according to claim 15, further comprising means of updating at least some of the coded values of the tag tree according to the insertion of a block of data in the body of the skeleton.

17. A device for forming a derived digital signal from a compressed digital signal which has been obtained by compressing an original digital signal including original data representing physical quantities and grouped together in blocks of data ordered in the original signal, said device comprising:

means of obtaining information contained in the compressed digital signal and representing a structure of the signal and an organization of the data therein; and means of forming a skeleton of the derived digital signal from the information, and which at least partly contains the information and at least one header and one body intended to subsequently contain compressed blocks of data, the skeleton thus formed being in accordance with a description syntax of the compressed signal, wherein said means of forming a skeleton of the derived digital signal form part of a first communication apparatus which communicates at a distance with a second communication apparatus in which the compressed digital signal is stored.

18. A device according to claim 17, further comprising means of transmitting, to the second communication apparatus, a request for obtaining information contained in the compressed digital signal and representing the structure of the compressed signal and the organization of the data therein.

19. A data processing apparatus, having a device for forming a derived digital signal according to claim 12.

20. An information storage means which can be read by a computer or a microprocessor including code instructions of a computer program for executing the steps of the derived digital signal formation method according to claim 1.

21. A computer-readable medium storing code instructions of a computer program for executing the steps of the derived digital signal formation method according to claim 1.

22. A computer program stored in a computer-readable medium, which includes sequences of instructions or portions of software code for implementing the steps of the derived digital signal formation method according to claim 1, when executed by a programmable apparatus.

23. A data processing apparatus, having a device for forming a derived digital signal according to claim 17.

24. An information storage means which can be read by a computer or a microprocessor including code instructions of a computer program for executing the steps of the derived digital signal formation method according to claim 9.

25. A computer-readable medium storing code instructions of a computer program for executing the steps of the derived digital signal formation method according to claim 9.

26. A computer program stored in a computer-readable medium, which includes sequences of instructions or portions of software code for implementing the steps of the derived digital signal formation method according to claim 9, when executed by a programmable apparatus.

* * * * *

UNITED STATES PATENT AND TRADEMARK OFFICE
CERTIFICATE OF CORRECTION

PATENT NO. : 7,113,643 B2
APPLICATION NO. : 10/279729
DATED : September 26, 2006
INVENTOR(S) : Fabrice Le Leannec et al.

It is certified that error appears in the above-identified patent and that said Letters Patent is hereby corrected as shown below:

COLUMN 1:

Line 30, "block of datas" should read --blocks of data--; and
Line 37, "block of datas" should read --blocks of data--.

COLUMN 2:

Line 4, "the," should read --the--;
Line 17, "steps" should read --steps:--; and
Line 32, "has;" should read --has:--.

COLUMN 3:

Line 51, "includes," should read --includes--.

COLUMN 4:

Line 66, "description" should read --description,--.

COLUMN 6:

Line 5, "the," should read --the--.

COLUMN 8:

Line 5, "represent" should read --represents--; and
Line 51, "thereof. Let" should read --thereof. ¶ Let--.

COLUMN 12:

Line 2, "pr" should read --or--; and
Line 64, "is," should read --is--.

COLUMN 13:

Line 31, "constructed. More" should read --constructed. ¶ More--;
Line 36, "planes. This" should read --planes. ¶ This--; and
Line 45, "be:" should read --be--.

UNITED STATES PATENT AND TRADEMARK OFFICE
CERTIFICATE OF CORRECTION

PATENT NO.        : 7,113,643 B2
APPLICATION NO.   : 10/279729
DATED             : September 26, 2006
INVENTOR(S)       : Fabrice Le Leannec et al.

It is certified that error appears in the above-identified patent and that said Letters Patent is hereby corrected as shown below:

COLUMN 14:

Line 30, "indicate:" should read --indicate--; and
Line 46, "block of datas" should read --blocks of data--.

COLUMN 17:

Line 38, "block of datas" should read --blocks of data--.

COLUMN 19:

Line 52, "body" should read --body,--.

COLUMN 20:

Line 40, "dicta" should read --data--;
Line 63, "block" should read --block is--; and
Line 64, "body" should read --body,--.

COLUMN 21:

Line 29, "form" should read --forms--.

Signed and Sealed this

Twelfth Day of May, 2009

JOHN DOLL
*Acting Director of the United States Patent and Trademark Office*